(12) United States Patent
Eriksson

(10) Patent No.: US 6,262,630 B1
(45) Date of Patent: Jul. 17, 2001

(54) RAPIDLY-RESPONDING DIODE DETECTOR WITH TEMPERATURE COMPENSATION

(75) Inventor: Hans Eriksson, Järfälla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/326,764

(22) Filed: Jun. 4, 1999

(51) Int. Cl.[7] ................................................. H03G 3/20
(52) U.S. Cl. .......................... 330/129; 330/140; 330/143; 330/289; 455/127; 455/126; 327/332; 329/352
(58) Field of Search ................................. 330/129, 140, 330/143, 289; 455/126, 116, 127; 327/50, 332, 562, 563; 329/352

(56) References Cited

U.S. PATENT DOCUMENTS

| | | | |
|---|---|---|---|
| 3,988,689 | * 10/1976 | Ochi et al. ............................ | 330/253 |
| 4,502,015 | 2/1985 | Nicholas et al. ...................... | 329/166 |
| 4,523,155 | 6/1985 | Walczak et al. ...................... | 330/279 |
| 4,922,132 | 5/1990 | Horvitz et al. ........................ | 307/359 |
| 5,120,995 | * 6/1992 | Abdi ..................................... | 307/351 |
| 5,245,297 | * 9/1993 | Claydon et al. ...................... | 330/129 |
| 5,423,081 | * 6/1995 | Thiele et al. .......................... | 330/129 |
| 5,448,770 | 9/1995 | Hietala et al. ........................ | 455/126 |

FOREIGN PATENT DOCUMENTS

| | | |
|---|---|---|
| 834 987 | 4/1998 | (EP) . |
| 57-154912 | 9/1982 | (JP) . |
| 59-133404 | 7/1984 | (JP) . |
| 62-241406 | 10/1987 | (JP) . |
| 7162239 | 6/1995 | (JP) . |

* cited by examiner

*Primary Examiner*—Michael B Shingleton
(74) *Attorney, Agent, or Firm*—Burns, Doane, Swecker & Mathis, L.L.P.

(57) ABSTRACT

A diode detector that is stable and linear over a wide range of variations in both temperature and power supply voltage and can be used to regulate a.c. signals produced by devices that are responsive to control signals includes a detector diode and a first resistor in series, a capacitor connected between the junction of first resistor and the detector diode and a reference potential, and a compensator diode and a second resistor in series with each other and with the detector diode and first resistor. An input a.c. signal is provided to a first terminal of the detector diode, and a rectified signal is provided at the junction of the detector diode, the first resistor, and the capacitor. The detector diode and the compensator diode have temperature coefficients that are substantially the same, and those diodes have the same polarities. An output buffer amplifier may receive the diode detector's output signal, the buffer amplifier having an input bias current that is low relative to an average rectified signal current through the compensator diode. The detector diode and the compensator diode may be Schottky-type diodes and the output buffer amplifier may be a FET-input operational amplifier. A signal generator having a regulated output and employing the diode detector is also disclosed.

7 Claims, 2 Drawing Sheets

RAPIDLY-RESPONDING DIODE DETECTOR WITH TEMPERATURE COMPENSATION

BACKGROUND

This invention relates to diode detectors and more particularly to a diode detector that is used for regulating the level of a radio-frequency (RF) signal and that is stabilized against variations of temperature and other parameters. Such a diode detector may be included in a radio telephone for regulating the output power of the telephone's transmitter.

Regulator loops having stabilized or compensated diode detectors are used in many applications where the alternating current (a.c.) output signal from an amplifier or other component is monitored to ensure a correct level. One exemplary application is a radio telephone, where the RF output signal from the telephone transmitter's power amplifier is monitored to ensure that it has the correct transmission power level. Temperature-compensated detectors are frequently used for this purpose because the response of a diode detector usually varies with temperature to an unacceptable extent. This is particularly so for portable devices like radio telephones, which can experience extremes of both heat and cold and yet must maintain well-defined output power levels to avoid interfering with other devices.

Diode detectors are also useful in other parts of a radio telephone network. In a typical cellular radio telephone communication system, transceivers are located at multiple fixed sites throughout a geographic area for providing radio communication in their respective surrounding coverage areas, which are usually called cells. Each fixed site transceiver provides an interface between the public switched telephone network and portable radio telephones and other remote terminals located in its cell. The fixed site transceivers and radio telephones communicate by exchanging RF signals, employing various modes of operation (analog, digital, and hybrids) and access techniques such as frequency division multiple access (FDMA), time division multiple access (TDMA), code division multiple access (CDMA), and hybrids of these techniques.

In current cellular communication systems, communication channels are implemented by frequency-modulating RF carrier signals that have frequencies near 800 megahertz (MHz), 900 MHz, 1800 MHz, and/or 1900 MHz. Other current communication systems operate at other frequencies in the RF portion of the electromagnetic spectrum, such as the "Bluetooth" system at 2400 MHz. The output signals from amplifiers in such systems, for example the amplifiers in a cellular system's fixed sites, may also be monitored to ensure that they have the correct signal level.

One approach to meeting the power control requirements of these communication systems is to provide a stable RF signal detecting circuit that is not susceptible to variations in temperature and power supply voltage. Accordingly, there is a need for an improved signal detecting circuit that is highly stable and linear over a wide range of variations in both temperature and power supply voltage. Many other applications would also benefit from such an improved signal detecting circuit.

U.S. Pat. No. 4,523,155 discloses a temperature compensated diode detector, where a detector diode is incorporated in a half-wave rectifier. The compensator diode has a double function, as it partly compensates for the temperature dependence of the detector diode, and partly forms part of a bias circuit, whereby the voltage on the detector diode input is raised to a value corresponding to the voltage drop across the detector diode when it is conductive. The voltage on the detector diode output corresponds to the RF signal when it is positive, and otherwise assumes the value zero.

European Patent Publication No. EP 0 834 987 describes a regulator loop for controlling the RF output power from a power amplifier of a radio telephone that has a diode detector for detecting an RF signal from the power amplifier and for providing an output signal in response thereto, a controlling circuit for generating a control signal for the power amplifier that depends on the output signal from the diode detector and a reference signal representing the desired output power of the power amplifier. A portion of such a transmitter is shown in FIG. 1.

An RF signal is provided at an input of a power amplifier 3, in which the signal is amplified to achieve the desired transmission power level at the amplifier's output. A directional coupler 4 disposed at the output of the power amplifier 3 generates, via an inductive coupling, a loop signal representing the output signal of the power amplifier 3. The loop signal is fed to a diode detector 5 (shown schematically as a single diode), which generates a d.c. output signal that is proportional to the loop signal and thus the output of the power amplifier. The output signal of the diode detector 5 and a power control signal are summed up by two resistors $R_{10}$ and $R_{11}$, thereby generating an error signal that is amplified by a loop amplifier 6, the output of which controls the gain of the power amplifier 3.

According to EP 0 834 987, the diode detector 5 is a voltage divider configuration forming part of a d.c. path across which a d.c. bias is applied. The voltage divider configuration is a serial connection of two resistors, a detector diode, and a compensator diode, and the input and the output of the diode detector 5 are connected to respective terminals of the detector diode in the d.c. path.

Another diode detector is described in U.S. Pat. No. 4,523,155 to Walczak et al. A detector diode and a compensator diode are provided, although the diodes are not serially connected. The detector diode is forward-biassed by a generator that includes the compensator diode, which is selected to provide temperature compensation.

U.S. Pat. No. 5,448,770 to Hietala et al. also describes a diode detector in which two diodes are not serially connected. The temperature coefficients of the diodes are compensated by a complex arrangement that generates the diodes' bias currents such that the currents have oppositely directed temperature coefficients.

These previous diode detectors suffer from various disadvantages, such as circuit complexity and/or imperfect temperature compensation. Accordingly, there is a need for a simpler diode detector that is better compensated than previous devices.

SUMMARY

Applicant's invention provides diode detectors that are highly stable and linear over a wide range of variations in both temperature and power supply voltage and can be used to regulate a.c. signals produced by devices that are responsive to control signals.

In one aspect of the invention, such a diode detector includes a detector diode and a first resistor in series, a capacitor connected between the junction of first resistor and the detector diode and a reference potential, and a compensator diode and a second resistor in series with each other and with the detector diode and first resistor. An input a.c. signal is provided to a first terminal of the detector diode, and a rectified signal is provided at the junction of the detector diode, the first resistor, and the capacitor. The detector diode and the compensator diode have temperature coefficients that are substantially the same, and those diodes have the same polarities.

The diode detector may be used with an interface component such as an output buffer amplifier, with the diode detector's output signal being provided to an input of the buffer amplifier and the buffer amplifier having an input bias current that is low relative to an average rectified signal current through the compensator diode. The detector diode and the compensator diode may be Schottky-type diodes and the output buffer amplifier may be a FET-input operational amplifier.

The diode detector may further include a reference voltage source disposed in series with the compensator diode and the second resistor, with the reference voltage source being connected to either the second resistor or the compensator diode, according to which of those devices is not directly connected to the detector diode.

In another aspect of the invention, a signal generator having a regulated output is provided. The signal generator includes an amplifier having an amplifier output signal of a magnitude that is responsive to a control signal; a coupler that receives the amplifier output signal and generates an a.c. signal that corresponds to the amplifier output signal; a detector diode and a first resistor in series; a capacitor connected between the junction between the detector diode and first resistor and a reference potential; a compensator diode and a second resistor in series with each other and with the detector diode and first resistor; and an interface component such as an output buffer amplifier.

The a.c. signal produced by the coupler is provided to a first terminal of the detector diode, and a rectified signal is provided at the junction of the detector diode and the first resistor. The detector diode and the compensator diode have temperature coefficients that are substantially the same, and those diodes have the same polarities. The buffer amplifier has an input bias current that is low relative to an average rectified signal current through the compensator diode.

The detector diode and the compensator diode may be Schottky-type diodes and the output buffer amplifier may be a FET-input operational amplifier. The signal generator may further include a reference voltage source disposed in series with the compensator diode and the second resistor, with the reference voltage source being connected to either the second resistor or the compensator diode, according to which of those devices is not directly connected to the detector diode.

BRIEF DESCRIPTION OF THE DRAWINGS

The objects and advantages of Applicant's invention will be understood by reading this description in conjunction with the drawings, in which.

DETAILED DESCRIPTION

Although the invention will be explained in connection with a regulation loop of a power amplifier in a radio telephone, the invention may be applied in other environments in which it is desired to determine the level of or to regulate an a.c. signal, even very low frequency a.c. signals.

Figure 2A:
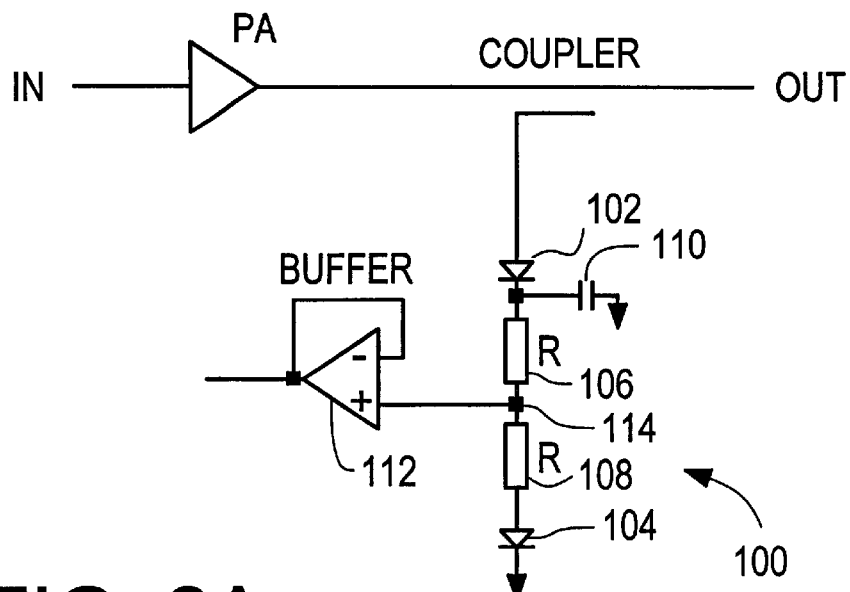
FIGS. 2A and 2B are diagrams of alternative configurations of a diode detector in accordance with Applicant's invention.
Figure 2B:
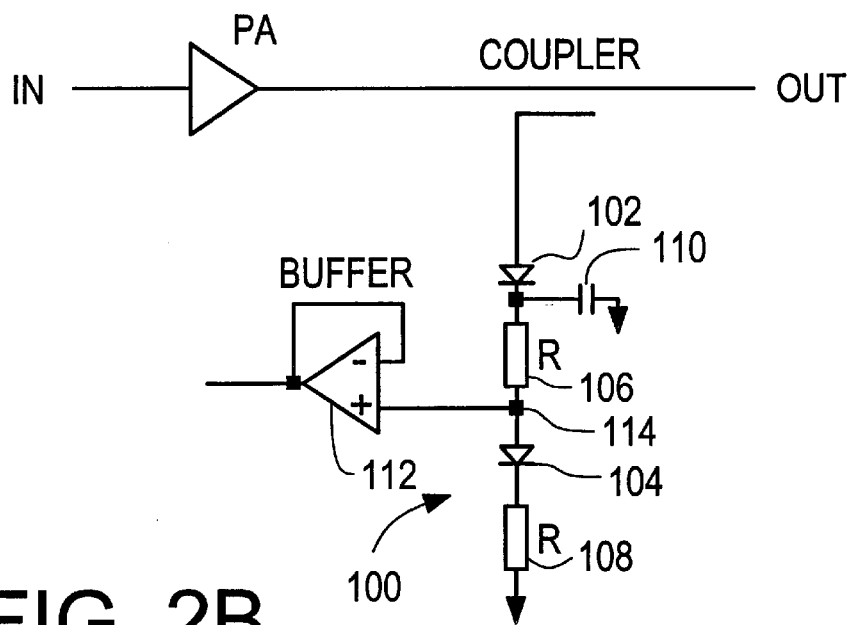

FIGS. 2A and 2B are diagrams of alternative configurations of an improved diode detector 100 in accordance with Applicant's invention configured for determining the level of a signal generated by a coupler that corresponds to the output of a power amplifier PA. The detector 100 comprises a serial configuration of a detector diode 102, a compensator diode 104, and resistors 106, 108. A capacitor 110 is included for holding the charge passed by the detector diode 102. An output signal generated by the diode detector 100 is provided to an interface component 112 for reasons that are explained in more detail below.

In the arrangements shown in FIGS. 2A and 2B, the input signal is provided to one terminal of the detector diode 102, and the output signal generated by the diode detector 100 that corresponds to the level of the input signal is picked off between the resistors 106, 108. The order of the compensator diode 104 and the resistor 108 is not currently believed to be critical, i.e., the diode 104 and resistor 108 can be interchanged since their order has no effect on the operation of the detector 100. FIG. 2A shows those components in one order and FIG. 2B shows those components in the other order; otherwise, FIG. 2A is identical to FIG. 2B.

At least to a first-order approximation, both diodes 102, 104 have the same average current because they are serially connected. If both resistors 106, 108 have the same resistance value, then it is easy to see that the voltage at the input to the buffer (the output generated by the detector 100) is one-half of the a.c.-input voltage from the coupler. This simple assumption is a very good approximation in practice as shown by computer simulation and experimental measurements.

It will be understood that the frequency of the signal being sensed, i.e., the frequency of the outputs of the coupler and power amplifier, affects the type of diodes that are suitable for the diodes 102, 104. At the frequencies typical of cellular radio telephony, Schottky diodes are suitable, with diodes having low breakdown voltages currently being preferred since they have lower capacitance. The HP 282X series and in particular the HSMS 382K devices are matched, high isolation, Schottky diodes that are available from Hewlett-Packard and are suitable. Such diodes can result in a detector 100 having a maximum output voltage of about four volts (limited by the breakdown voltage of the diodes) and having substantially the same response to signals at 900 MHz and 1900 MHz.

Of course, in general the diodes should be equal, i.e., have the same temperature coefficient, and have the same temperature in order for the output signal of the detector 100 to be temperature compensated. Thus, both diodes preferably are the same type and both are disposed together in a common encapsulation. In general, it is necessary to minimize coupling between the diodes to avoid signal rectification by the compensator diode 104. Thus, for high frequency a.c. signals like those described above (800–2500 MHz), the diodes can be disposed in one encapsulation on separate substrates with an intervening shield for isolation as in the HP devices identified above. As the frequency of the a.c. signal being sensed decreases, rectification by the compensator diode due to a.c. coupling between the diodes becomes less and less of a concern, permitting other ways of achieving the desired diode commonality to be used, e.g., by using the base-emitter or gate-source diodes of a pair of matched transistors. It will be appreciated that it is possible to ensure that the diodes have the same temperature in a variety of ways other than disposition in a common encapsulation.

The values of the resistors 106, 108 should generally be selected to prevent excessive loading of the coupler and power amplifier PA and any following components by the detector 100. Applicant has obtained satisfactory performance when resistors 106, 108 are each 4.7 kilohms. Similarly, the value of the capacitor 110 should generally be selected to enable the output of the detector 100 to change rapidly enough to reflect sufficiently accurately changes in the level of the signal being monitored. Applicant has found that if the capacitor 110 is 4 picofarads, then the rise time of the output signal of the detector 100 is less than about one microsecond for detector output signals of about 100 millivolts. The capacitor 110 generally will have a larger value as the frequency of the input signal decreases.

The considerations that drive the selection of these values in Applicant's detector are substantially the same as the considerations that drive the selection of comparable components in other diode detectors. For example, the capacitor 110 advantageously smooths the rectified voltage at the junction 114 of the detector diode 102, resistor 106, and capacitor 110, holding that voltage between the peaks of the input a.c. signal, i.e., the a.c. signal applied to the other terminal of the diode 102. The droop of the rectified signal between the peaks of the input signal depends on the frequency of the input signal and the values of the capacitor 110 and resistors 106, 108. It will be appreciated that the rectified signal current flows through the resistors 106, 108 and the compensator diode 104 and that a scaled replica of the rectified signal voltage appears at the other terminal of the resistor 106.

For accurate compensation, it is important that the components that interface the output of the diode detector 100 to the rest of the environment, such as the buffer 112, do not add or subtract a current sufficient to noticeably upset the equality of the currents in both diodes 102, 104. In other words, the buffer 112 or other interface components should have a low bias current. One kind of buffer amplifier that can be suitable is an operational amplifier having input field-effect transistors (FETs). Typical FET-input op amps have input bias currents that are "low", i.e., negligible compared to the current flowing through the above-noted Schottky-type diodes 102, 104 for the minimal desired detector output signal, for a minimal desired detector output signal in the order of 50–100 millivolts. This type of op amp is usually thought to have a large input offset voltage, but today this type of op amp can be obtained having offset voltages of only a few millivolts, bias currents of substantially zero, and low cost.

It will be understood that the choice of a particular interface component such as the buffer 112 is not affected by the frequency of the signal whose level is being determined by the detector 100. The parameters affecting the choice are the usual ones: bias current, offset voltage, rise time, etc., which themselves are chosen based on the characteristics desired for the interface's output signal as well as for sufficiently small loading of the diode detector. In theory, the input bias current of the interface component should be zero, but in practice one can usually tolerate some amount of input bias current.

How much bias current is tolerable, i.e., "low" or "negligible", for a given diode detector is determined by the degree of output linearity and temperature stability desired for a particular application. The output signal of the detector 100 appears to decrease substantially linearly with decreases of the input signal until the rectified signal current becomes small enough for the departure from linearity caused by the input bias current of an interface component like the amplifier 112 to be noticeable. Moreover, as the rectified signal decreases, the rectified signal current flowing through the detector diode 102 becomes relatively more and more different (i.e., by the input bias current) from the rectified signal current flowing through the compensator diode 104, with the result that the temperature coefficient of the compensator diode 104 becomes more and more different from the temperature coefficient of the diode 102. Applicant currently believes that the input bias current of an interface component like buffer 112 is negligible, or low, when the bias current is on the order of about one percent of the average rectified signal current flowing through the compensator diode 104.

Figure 1:
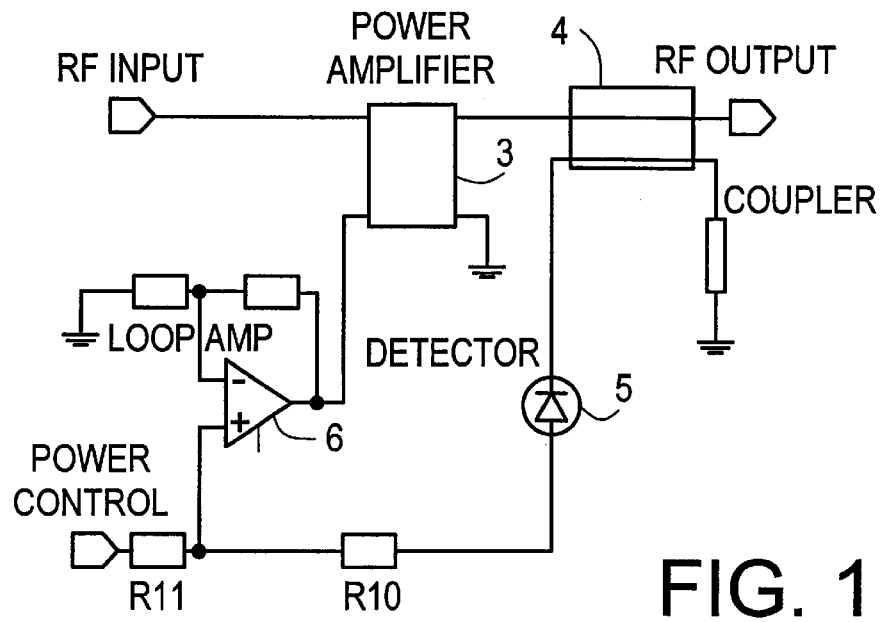
FIG. 1 shows a portion of a prior transmitter.

Applicant's diode detector can be used advantageously in any of the environments in which previous diode detectors, such as those described above, are used. For example, the output of the interface components (buffer amplifier 112 in the Figures) can be used as the basis for a control signal to which the amplifier PA is responsive. Various details of such a regulated signal generator can be seen schematically in FIG. 1 and can be understood from the literature, including the documents cited above. Accordingly, further description here is unnecessary.

The arrangements of Applicant's diode detector that are shown in FIGS. 2A and 2B produce positive (with respect to ground) output voltages at the inputs of the buffer amplifiers 112 that increase as the power levels of the signals produced by the couplers increase. This characteristic can be modified in many ways if some other behavior is desired, e.g., if the detector output voltage should decrease as the power level increases. One way to obtain a desired characteristic is to provide suitable interface components, such as further signal conditioning components at the output of the buffer 112. The interface components, which might be a digital signal processor or other logic arrangement, would accept the output of detector 100 as input and then manipulate the signal as needed to obtain the desired characteristic.

Figure 3:
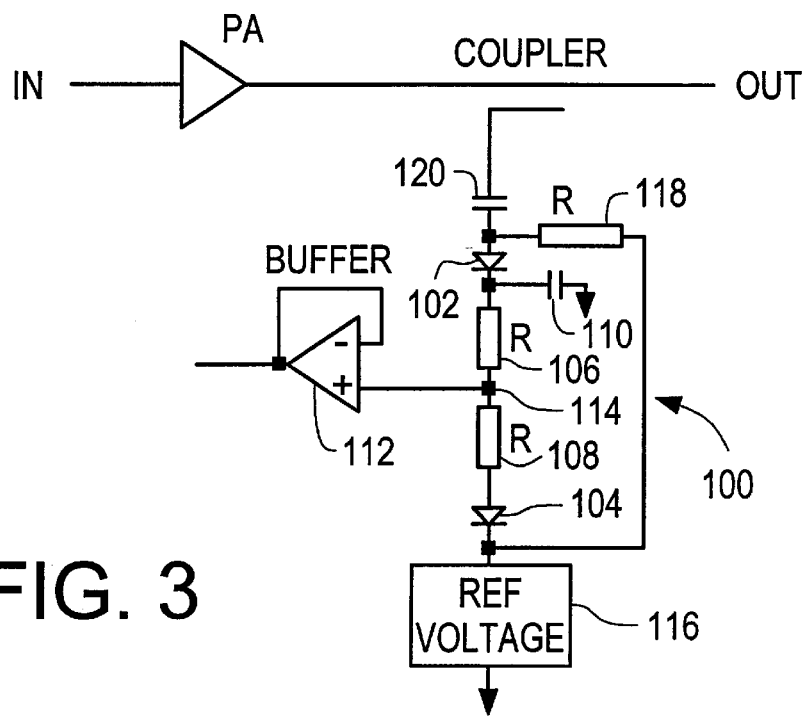
FIG. 3 shows another alternative configuration of a diode detector in accordance with Applicant's invention.

Another way to obtain a desired characteristic is to change the orientation of the components of the detector 100. For example, reversing the polarities of the diodes 102, 104 yields an output voltage from the buffer amplifier 112 that is negative with respect to ground and that becomes more negative as the sensed power level increases. As another example illustrated by FIG. 3, the output characteristic can be changed by serially connecting the diodes 102, 104 and resistors 106, 108 between the coupler and a positive or negative reference voltage 116, rather than ground, and with diode polarities either reversed or not with respect to those shown in FIGS. 2A, 2B. An additional resistor 118 and coupling capacitor 120 for d.c. blocking are preferably included. In this way, the output signal of the diode detector 100 can be made more or less positive or negative, depending on the reference voltage, and made increasing or decreasing for increasing sensed power level, depending on the polarities of the diodes.

One important difference between Applicant's diode detector 100 and previous diode detectors such as those described in EP 0 834 987 is that the diode detector described in the EP document is not configured to equalize the average current in the detector and compensator diodes. In fact, just the opposite is true in the EP document's detectors, the performance curves of which show a temperature dependent output voltage.

To get performance that is similar to the performance of a detector in accordance with Applicant's invention, one might use two d.c.-biassed diodes and a balanced amplifier, where one diode is a reference, the other diode is a rectifier, and the difference between the rectifier voltage and the reference voltage is taken as the output. The problems with such an arrangement are discussed above. An important advantage of a detector in accordance with Applicant's invention is that high performance, i.e., excellent temperature stability, low complexity, and low cost, is obtained without using either a d.c.-bias or a balanced amplifier.

It will be understood that it is not necessary in general for the resistors 106, 108 to have the same values, although they must have substantially the same temperature coefficients. Moreover, one of the advantages of Applicant's diode detector is that it does not have to be temperature stabilized, e.g. by mounting all of the components in an oven, provided that the diodes 102, 104 have matching temperature coefficients, the resistors 106, 108 have matching temperature coefficients (that are not necessarily the same as the diodes' temperature coefficients), and that the output voltage of the buffer amplifier 112 has a suitable temperature coefficient over the desired operating temperature range.

Applicant's invention is described above with reference to particular embodiments, and it will be readily apparent to those skilled in the art that it is possible to embody the invention in forms other than those described above. The particular embodiments described above are merely illustrative and should not be considered restrictive in any way. The scope of the invention is determined given by the following claims, and all variations and equivalents that fall within the range of the claims are intended to be embraced therein.

I claim:

1. A diode detector for generating an output signal that follows an input a.c. signal, comprising:

a detector diode and a first resistor in series, the input a.c. signal being provided to a first terminal of the detector diode, a rectified signal being provided at a second terminal of the detector diode that is connected to a first terminal of the first resistor, the detector diode having a temperature coefficient, and the output signal being provided at a second terminal of the first resistor;

a capacitor having a first terminal connected via a low impedance path to the second terminal of the detector diode and a second terminal connected to a reference potential; and a compensator diode and a second resistor in series, the compensator diode and second resistor being disposed in series with the detector diode and first resistor, the output signal being provided to one of a first terminal of the compensator diode and a first terminal of the second resistor, and the compensator diode having substantially the same temperature coefficient and the same polarity as the detector diode.

2. The diode detector of claim 1, further comprising an output buffer amplifier, the output signal being provided to an input of the buffer amplifier and the buffer amplifier having an input bias current that is low relative to an average rectified signal current through the compensator diode.

3. The diode detector of claim 2, wherein the detector diode and the compensator diode are Schottky-type diodes and the output buffer amplifier is a FET-input operational amplifier.

4. The diode detector of claim 1, further comprising a reference voltage source disposed in series with the compensator diode and the second resistor, the reference voltage source being accordingly connected to one of a second terminal of the second resistor and a second terminal of the compensator diode, whereby a level of the output signal can be selected.

5. A signal generator having a regulated output, comprising:

an amplifier having an amplifier output signal of a magnitude that is responsive to a control signal;

a coupler that receives the amplifier output signal and generates an a.c. signal that corresponds to the amplifier output signal;

a detector diode and a first resistor in series, the a.c. signal being provided to a first terminal of the detector diode, a rectified signal being provided at a second terminal of the detector diode that is connected to a first terminal of the first resistor, the detector diode having a temperature coefficient, and a detector output signal being provided at a second terminal of the first resistor;

a capacitor having a first terminal connected via a low impedance path to the second terminal of the detector diode and a second terminal connected to a reference potential;

a compensator diode and a second resistor in series, the compensator diode and second resistor being disposed in series with the detector diode and first resistor, the detector output signal being provided to one of a first terminal of the compensator diode and a first terminal of the second resistor, and the compensator diode having substantially the same temperature coefficient and the same polarity as the detector diode; and an output buffer amplifier, the detector output signal being provided to an input of the output buffer amplifier, the output buffer amplifier having an input bias current that is low relative to an average rectified signal current through the compensator diode, and the control signal being based on an output of the output buffer amplifier.

6. The signal generator of claim 5, wherein the detector diode and the compensator diode are Schottky-type diodes and the output buffer amplifier is a FET-input operational amplifier.

7. The signal generator of claim 5, further comprising a reference voltage source disposed in series with the compensator diode and the second resistor, the reference voltage source being accordingly connected to one of a second terminal of the second resistor and a second terminal of the compensator diode, whereby a level of the detector output signal can be selected.

* * * * *